United States Patent [19]
Smith et al.

[11] Patent Number: 5,501,925
[45] Date of Patent: Mar. 26, 1996

[54] HIGH POWER MASKS AND METHODS FOR MANUFACTURING SAME

[75] Inventors: Adlai H. Smith, San Diego; Robert O. Hunter, Jr., Rancho Santa Fe; Bruce B. McArthur, San Diego, all of Calif.

[73] Assignee: Litel Instruments, San Diego, Calif.

[21] Appl. No.: 250,694

[22] Filed: May 27, 1994

[51] Int. Cl.⁶ .......................................................... G03F 9/00
[52] U.S. Cl. ........................... 430/5; 430/322; 430/323; 216/48
[58] Field of Search ................................. 430/5, 322, 323; 156/643

[56] References Cited

U.S. PATENT DOCUMENTS

| | | |
|---|---|---|
| 4,684,436 | 8/1987 | Burns et al. . |
| 4,923,772 | 5/1990 | Kirch et al. . |
| 5,328,785 | 7/1994 | Smith et al. .................... 430/5 |

*Primary Examiner*—S. Rosasco
*Attorney, Agent, or Firm*—Townsend and Townsend and Crew

[57] ABSTRACT

A method and apparatus for the production of transparent phase reticule mask for projecting high intensity light—such as that used for direct laser ablation of materials from substrates—is disclosed. The transparent phase reticule mask includes first portions which are for scattering light beyond the solid angle of an imaging system and second transparent portions which scatter light to an angle where projection by an imaging system can occur. Phase reticule mask configurations are disclosed including a known phase reticule mask which has gratings, and a new phase reticule mask having random phase roughening for the scattering of light. Random phase roughening includes imparting to the roughened area a mean solid angle of scattering that exceeds the solid angle of collection of an image system. Thus, the total fraction of incident light is below the ablation threshold and constitutes the dark patterned region of the mask. Techniques for fabrication are disclosed with include constructively/destructively interfering waves for patterning photoresist for the formation of half wave gratings, and phase roughening utilizing a speckle pattern exposure. In each case, exposure of transparent portions of the mask from the opposite side of the mask renders the double exposed portion of the mask suitable for light transmission with the remaining portions of the mask for light scattering. A method of phase roughening is also disclosed which includes exposure of the blocking area of the mask to an acid etch to impart the blocking regions of the mask.

11 Claims, 9 Drawing Sheets

HIGH POWER MASKS AND METHODS FOR MANUFACTURING SAME

This invention relates to a high power phase mask, and method and apparatus for the fabrication of high power mask for the preferred direct ablation of workpieces by laser. Specifically, the disclosed high power masks have patterned transparent and scattering portions for producing high power images for patterned ablation at a workpiece.

BACKGROUND OF THE INVENTION

Projection imaging systems are widely used in the photolithographic steps of semiconductor and printed circuit board manufacture. A conventional projection system includes a light source, a mask consisting of transmissive and blocking regions and projection optics. Conventional imaging system masks modulate light by selectively reflecting and/or absorbing the light at the blocking regions. Commonly used masks are chrome on glass and dielectric on glass.

The direct patterned ablation of workpieces by laser offers the opportunity to simplify materials processing. High power patterned light is required for direct patterned ablation.

At high powers and/or extended exposures, absorption of light at masks either erodes the mask or damages it. Chrome coated masks use reflection and absorption as the blocking mechanism while dielectric masks use reflection as the blocking mechanism. In either case, damage to the mask can occur.

Conventional photomasks consisting of chrome on quartz or low expansion glass are inadequate at high power densities because their thin (approximately 1000 Å) metal layer either gradually erodes or, under more severe conditions, is rapidly removed. Reflective multilayer dielectric masks have been used successfully for a number of years in scanning ablation tools. These reflective multilayer dielectric masks can withstand single shot fluences that are relatively high (approximately 1 J/cm$^2$ @ l=248 nm). However, for sustained operation the safe operating level is at the several hundred millijoule/cm$^2$ level. These reflective multilayer dielectric masks have nowhere near the durability of pure quartz or glass masks. In addition, the steps required to produce a dielectric mask increase cost by a factor of approximately 5× to that of a conventional reticule mask.

SUMMARY OF THE INVENTION

A method and apparatus for the production of transparent phase reticule mask for focusing high intensity light—such as that used for direct laser ablation of materials from substrates—is disclosed. The transparent phase reticule mask includes first portions which are for scattering light beyond the solid angle of an imaging system and second transparent portions which scatter light to an angle where projection by an imaging system can occur. Phase reticule mask configurations are disclosed including a known phase reticule mask which has gratings, and a new phase reticule mask having random phase roughening for the scattering of light. Random phase roughening includes imparting to the roughened area a solid angle of scattering that exceeds the solid angle of collection of an imaging system. Thus, in the case of laser ablation, the total fraction of incident light imaged by the phase roughened areas can be made to be below the ablation threshold and constitutes the dark patterned region of the mask. Techniques for fabrication are disclosed which include constructively/destructively interfering waves for patterning photoresist for the formation of half wave gratings, and phase roughening utilizing a speckle pattern exposure. In each case, exposure of transparent portions of the mask from the opposite side of the mask renders the double exposed portion of the mask suitable for light transmission with the remaining portions of the mask for light scattering. A method of phase roughening is also disclosed which includes exposure of the blocking area of the mask to an acid etch to impart the blocking regions of the mask.

The immediate advantage of a phase reticule mask is the power handling capability. Because patterned side is bare quartz and at most the blank side is coated with an antireflection coating, the disclosed phase reticule mask can withstand much higher fluences than conventional masks.

Applications of phase reticule masks include projection photolithography—conventional 1:1 or reduction systems. Masks consisting of pure glass having the imaging information etched into the glass with at most an antireflection coating are more durable than conventional photolithographic masks. They are better able to withstand repeated handling and cleanings, and will not erode substantially with time or use because of their monolithic construction.

Enlargement projection lithography can be used. This has applications in large area photolithography used in manufacture of flat panels and printed circuit boards. The difficulty of using a conventional mask in this role is that reduction allows less power density on the mask than on the workpiece.

It will be noted that a mask used in an enlarging system sees more power density on the mask than on the workpiece (this power density increasing as the square of the enlargement factor). The net effect of going from a reducing to an enlarging system and maintaining the same power density at the workpiece (and therefore the same exposure time at the workpiece) is to increase the power density on the mask by a factor of the forth power. Thus a 1:5 enlarging system requires masks capable of withstanding $5^4$=625 times greater power densities than that required in the 1:1 imaging system. Even a more modest 1:3 enlarging system requires $3^4$=81 times greater power handling capacity. It can be seen that a mask with capability to handle large power densities is desirable for use in enlargement projection photolithography.

The mask can further be used in projection ablation. Unlike photolithography, ablation of a workpiece requires energy delivered in relatively short pulses. As a result, the instantaneous intensities on the workpiece and the mask are generally higher than in the case of projection lithography. In this case, the ability of a mask to withstand high fluences is more important.

DESCRIPTION OF THE PREFERRED EMBODIMENT

Figure 1:
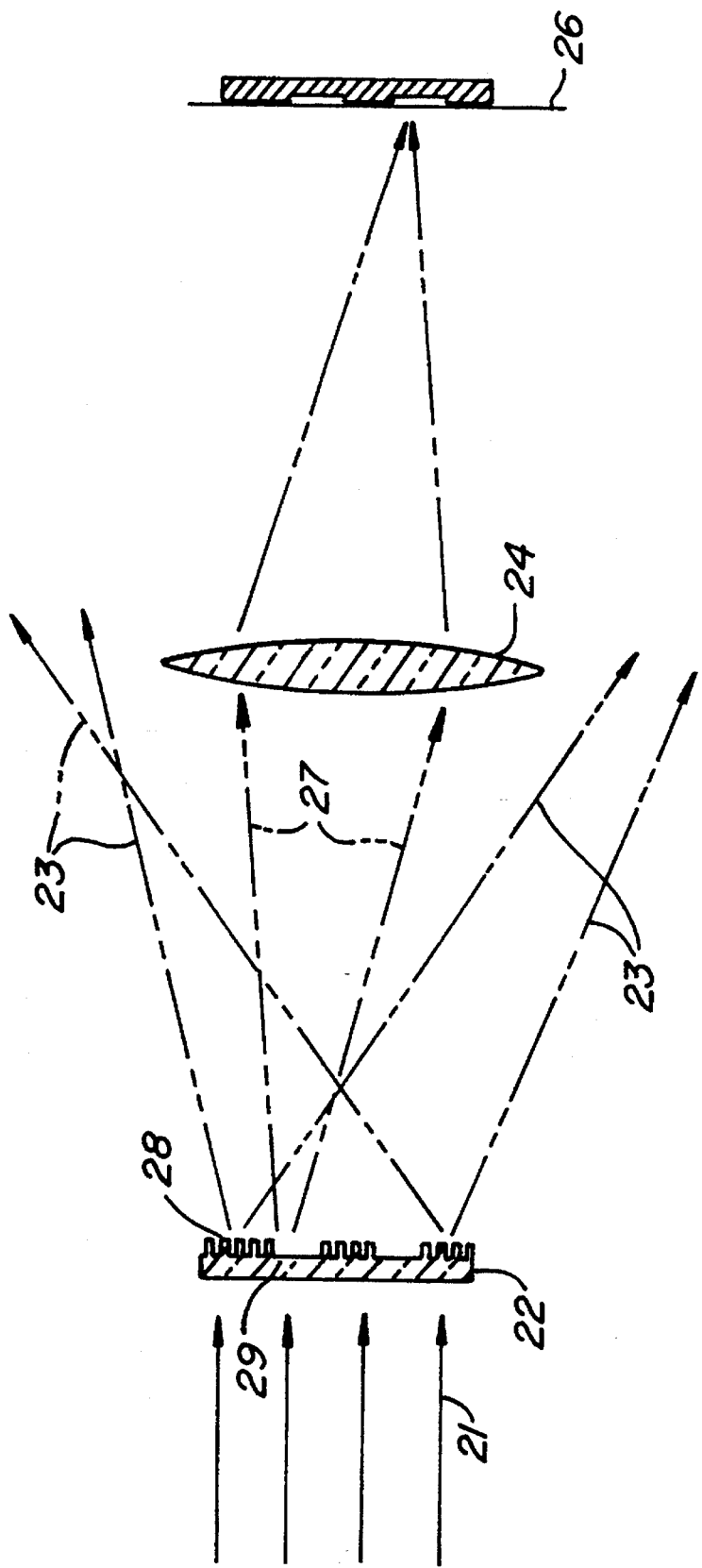
FIG. 1 is a side elevation schematic of an imaging system utilizing the phase reticule masks of this invention in the form of a light scattering grating such as that shown in our co-pending U.S. Pat. No. 5,364,493 filed May 6, 1993 and entitled Apparatus and Process for the Production of Fine Line Metal Traces.

FIG. 1 schematically illustrates the action of an imaging system utilizing a phase grating mask. For simplicity, parallel light 21 incident on the phase grating mask 22. This parallel light 21 either hits clear region 29 or a region patterned with binary grating 28. Light hitting clear region 29 (which corresponds to a feature desired in the image) is diffracted conventionally as rays 27. Rays 27 pass through clear region 29 and fall within the aperture stop of imaging objective 24 (here represented by a single lens). As a result, rays 27 are then recombined in object plane 26 to make the desired feature. Light intensity in rays 21 is sufficient for ablation or photo exposure of workpiece W on object plane 26.

Light striking binary grating 28 is diffracted at high angles. As a consequence, rays 23 fall outside the aperture stop of the imaging objective and the corresponding region in the object plane. This region is therefore not illuminated.

Figure 9:
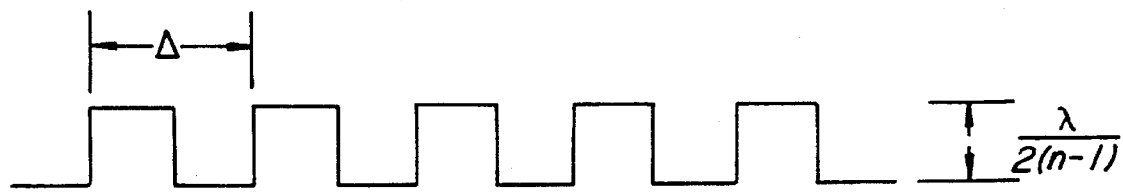
FIG. 9 is a side elevation schematic of the blocking portion of a grating illustrating the relationship of grating period to wave length for the production of light scattering.

FIG. 9 illustrates the cross section of a binary grating. Grating period determines scattering power. For illumination, light with partial coherence σ, and an imaging objective with numerical aperture on the object side NA, the maximum allowable value for the grating period Λ, is given by:

Λ<1/NA*(2+σ).

For example, a system suitable for flat panel exposure is a 1:5 enlargement I-line system, (λ= 365 nm) with σ= 0.5 and NA= 0.50, resulting in Λ< 0.8 μm. While these line widths (0.40 μm) are achievable with conventional electron beam lithography tools, the cost of maintaining these feature sizes over large areas could be prohibitive.

The approach herein to fabricating phase grating masks is illustrated by FIGS. 4A–4F and FIG. 5. Conventional chrome on quartz reticule mask 31 has transparent openings 32 in the form of the desired pattern on either side of blocking pattern 33. (See FIG. 4A)

Next, it is coated with photoresist 34 and then exposed. This exposure is illustrated in FIG. 5.

Figure 5:
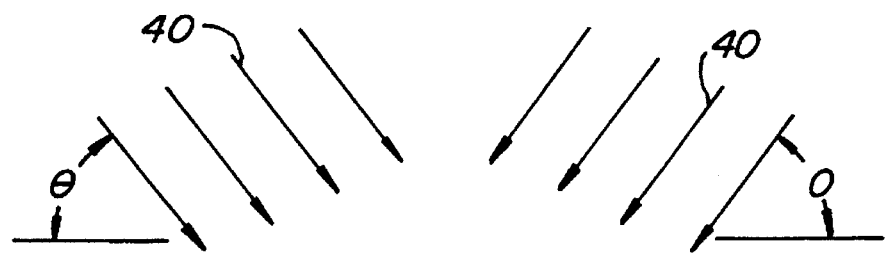
FIG. 5 is an optical schematic of the two step resist exposure in FIGS. 4B and 4C required to produce the grating patterns of FIGS. 3A–3C.
Figure 5:
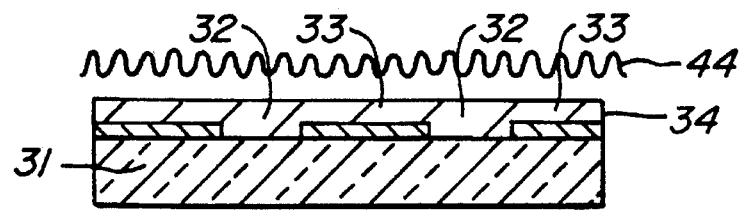
Figure 5:
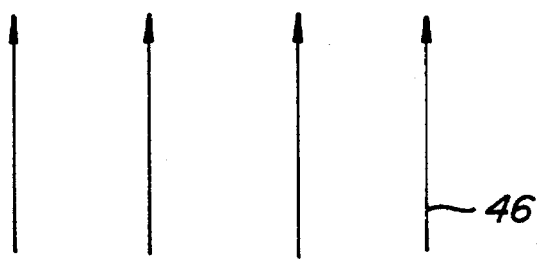

Referring to FIG. 5, photo-resist exposing light 40 (typically from an argon-ion laser) is incident upon conventional chrome on quartz reticule mask 31 at photoresist 34 from a divided coherent source (not shown) at angles Θ relative to the photoresist layer. As is well known, such light periodically destructively and constructively interferes with the result that grating pattern 36 (See FIG. 4C) is produced on photoresist 34. This much is conventional.

This conventional exposure has the novel exposure of photo-resist exposing light 46 from the underside of conventional chrome on quartz reticule mask 31. The result is that grating pattern 36 is only produced overlying blocking pattern 33 and double exposed out of transparent openings 32. It will be understood that the exposures here described can occur either simultaneously or in discrete steps.

There results a periodic pattern in the photoresist whose period is determined by the wavelength of photo-resist exposing light 40 and angle Θ between the two plane waves and the photoresist.

Remaining processing can be conventional. By way of example, baking followed by chrome etch leaves chrome gratings 37. (See FIG. 4D) Thereafter, glass etch 38 follows (See FIG. 4E) with stripping of baked resist and chrome layers 39 to leave conventional binary grating 28. (See FIG. 4F)

Figure 3A:
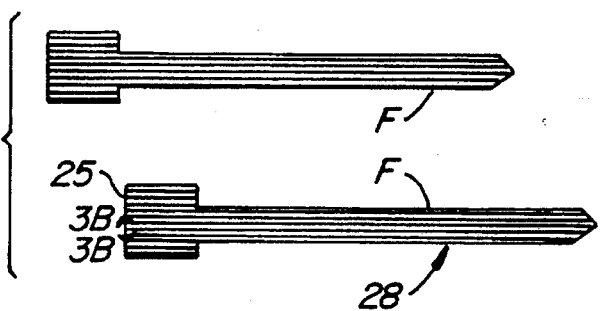
FIG. 3A, 3B, and 3C are respective plan images of features filled in with gratings for the scattering of light, an enlargement of the gratings for the scattering of the light, and finally a side elevation section of the gratings for the scattering of the light.
Figure 3B:
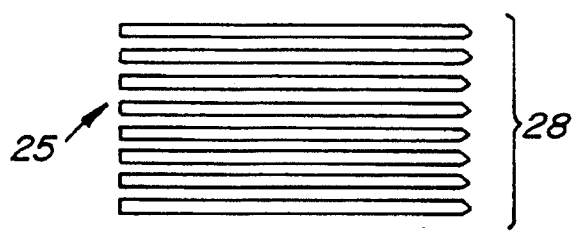
Figure 3C:
Figure 4A:
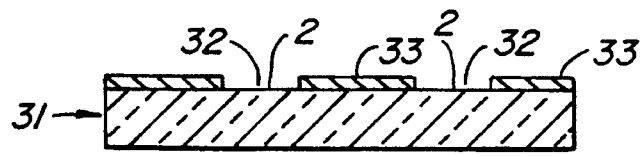
FIGS. 4A–4F are step schematics of a glass etch process for the manufacture of gratings having form similar to FIGS. 3A–3E.
Figure 4B:
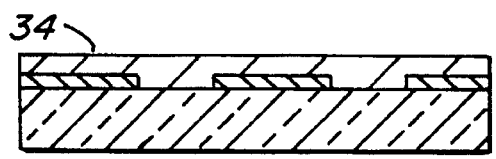
Figure 4C:
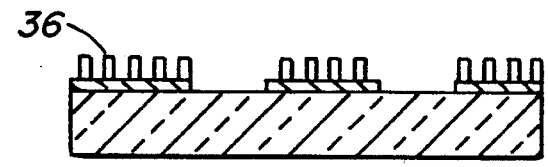
Figure 4D:
Figure 4E:
Figure 4F:
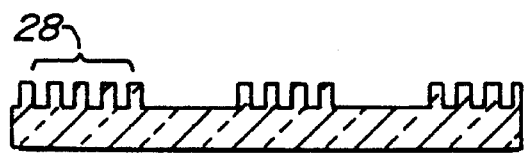

Referring to FIG. 3A, feature F is shown in format of binary grating 28. An expanded view of feature F is shown in FIG. 3B with boundary 25 shown in the enlarged portion of the illustration. Referring to FIG. 3C, a side elevation of phase grating mask 22 is illustrated.

As will be apparently, other techniques suitable for exposed photoresist processing may work as well. For example, and if necessary, a subsequent oxygen plasma etch is used to open up the resist gaps slightly. Further, it goes without saying that other coherent exposure methods which result in periodic patterns are also possible.

For light illuminating a phase grating mask with rectangular groove profiles, the maximum contrast between light and dark regions occurs when the groove depth=

$$\frac{\lambda}{2(n-1)}$$

and the grating duty cycle is 50%. For grating profiles other than rectangular, the highest contrast geometry can be readily determined.

It is clear that this is a relatively fast and simple process for producing phase reticule masks that requires no programmable lithography for feature sizes smaller than those desired in the projected pattern.

Phase "Roughened" Masks

Figure 2:
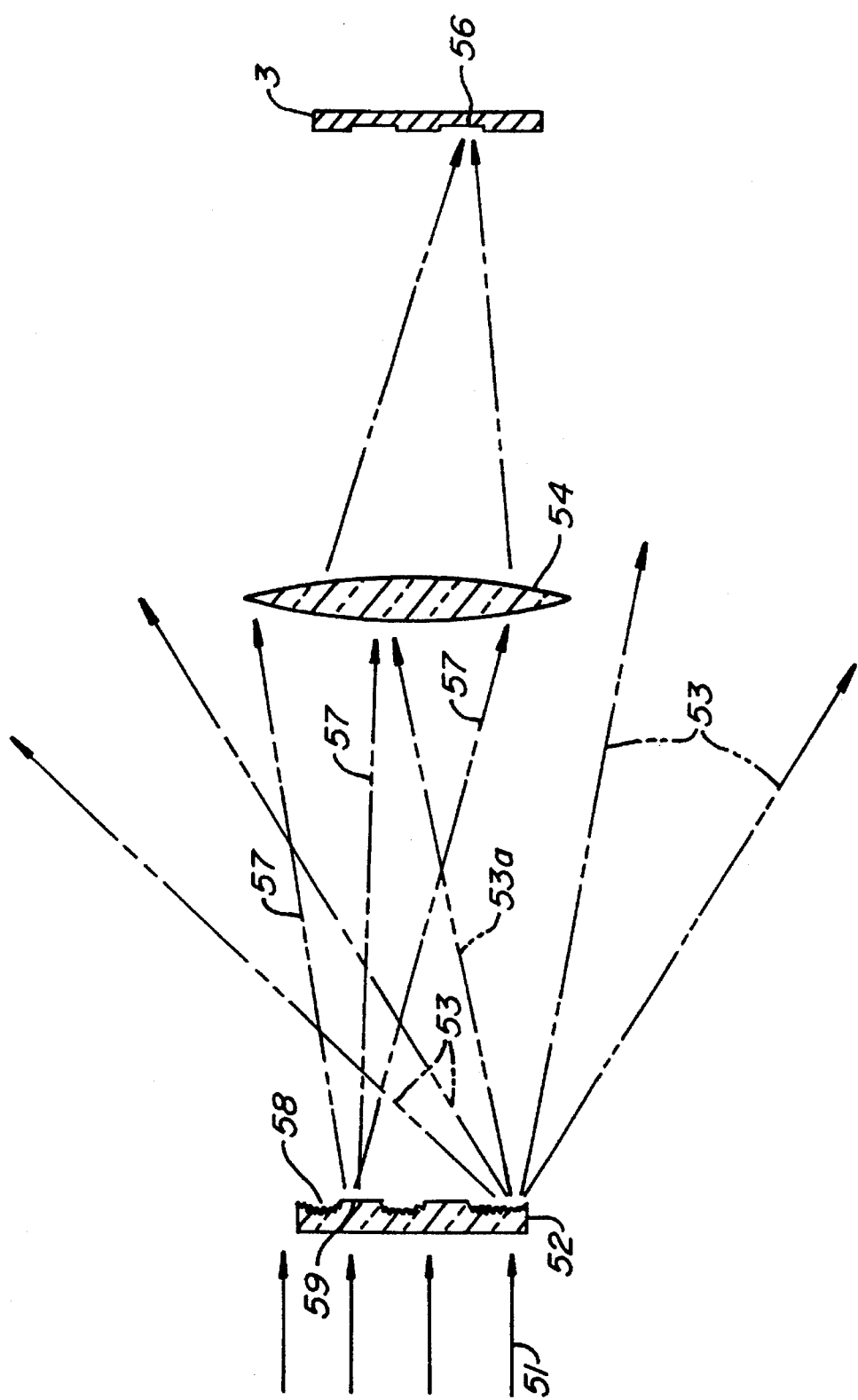
FIG. 2 is a side elevation similar to FIG. 1 illustrating a so-called "phase roughening" mask which scatters light largely into solid angles outside the numerical collecting aperture of the imaging system and in a sufficient fraction to reduce the projected intensity of phase roughened portion of the mask to an intended "dark" area on the workpiece.

Referring to FIG. 2, a so-called phase roughened mask 52 is illustrated. Operation of the mask will first be set forth with respect to FIG. 2, it being pointed out that the concept of the phase roughened mask is a point of novelty in this application. Thereafter, two exemplary illustrations of manufacture will be set forth.

In FIG. 2, incident light 51 contacts phase roughened mask 52 on smooth back side 50. This light passes through transparent mask areas 59 and phase roughened mask areas 58. The action at phase roughened mask areas 58 is easy to understand.

As before, a lens system having a imaging objective 54 (again represented by a single lens) receives light from transparent mask areas 59. At phase roughened mask areas 58 the major portion of light is dispersed outside imaging objective 54 as rays 53. However, and unlike the case of conventional chrome on quartz reticule mask 31, phase roughened mask cause imaging fraction rays 53a to pass through imaging objective 54 and image to the "dark" areas of workpiece W at object plane 56. A brief explanation of this phenomena followed by the utility of phase roughened mask 52 can be offered.

By way of explanation, phase roughened mask areas 58 are given a solid angle of light dispersal which exceeds the solid angle of collection of imaging objective 54 relative to phase roughened mask 52. Thus although some light is imaged, the major portion of the light—usually 90%—is discarded. Thus, the intensity of patterns produced on workpiece W by phase roughened mask areas 58 will be almost 10% of the areas imaged by transparent mask areas 59 on the workpiece.

Regarding, utility of such an arrangement, it will be remembered that this phase roughened mask 52 has its main utility in laser ablation of workpiece W. This being the case, an ablation threshold will be present. By having light from phase roughened mask areas 58 fall well below this threshold and light from transparent mask areas 59 fall well above this threshold, utility in ablation by phase roughened mask 52 is present. Since it will be seen that the phase roughened mask is simpler to fabricate, this phase roughened mask 52 provides at least a distinct economic advantage. Those having skill in the art will realize that some photoresists have similar thresholds for accumulated light dose. Accordingly, the phase roughened masks can have the same effect on such photoresists.

Figure 6A:
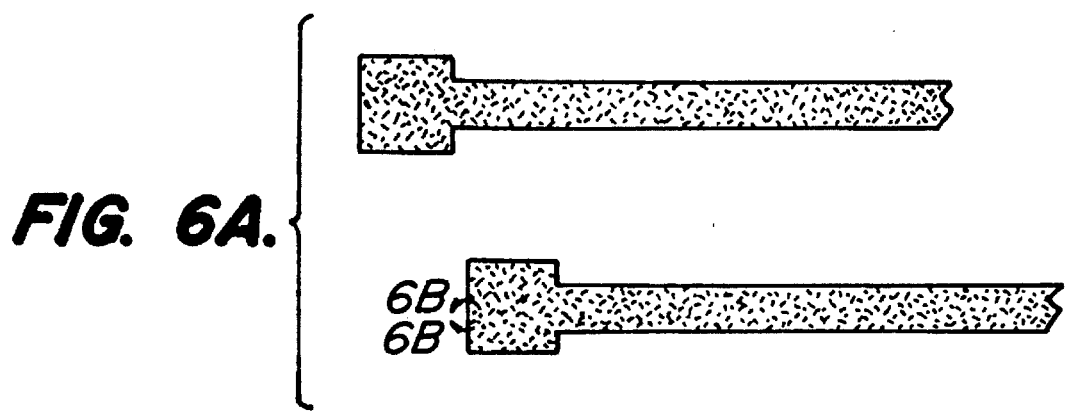
FIG. 6A, 6B, and 6C are respective images of phase roughened areas for the scattering of light, an enlargement of the phase roughened areas for the scattering of the light, and finally a side elevation section of the phase roughened areas for the scattering of the light.
Figure 6B:
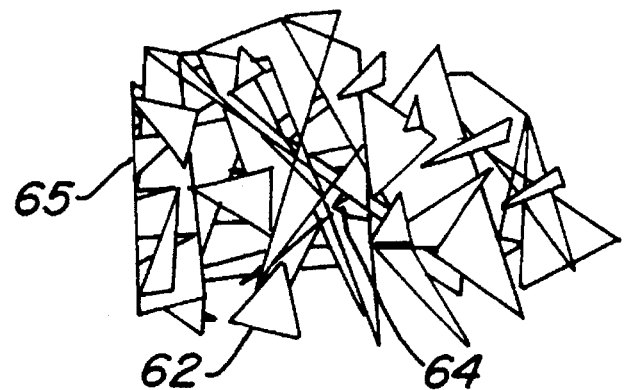
Figure 6C:

Referring to FIG. 6A, two features 60 of a phase roughened mask are illustrated. Referring to FIG. 6B, expanded light dispersing section 62 is shown having dispersal portion 64 with boundary 65. A side elevation of phase roughened mask 52 at phase roughened mask areas 58 and transparent mask areas 59 is shown in FIG. 6C.

At this point an important difference should be made between phase roughen mask 52 and phase grating mask 22 of FIG. 3A–3C. In phase grating mask 22 substantially all light of the particular order for which the period of the grating is selected is rejected from the receiving aperture of imaging objective 54. This is not the case with phase roughened mask 52. In phase roughed mask 52, dispersal is such that an intended fraction of light still falls within the receiving aperture of imaging objective 54. However, phase roughened mask 52 is easier to fabricate and does not require the careful attention to the generation of the required binary grating 28. It therefore has a distinct advantage.

Manufacture of Phase Roughening Masks

Figure 7:
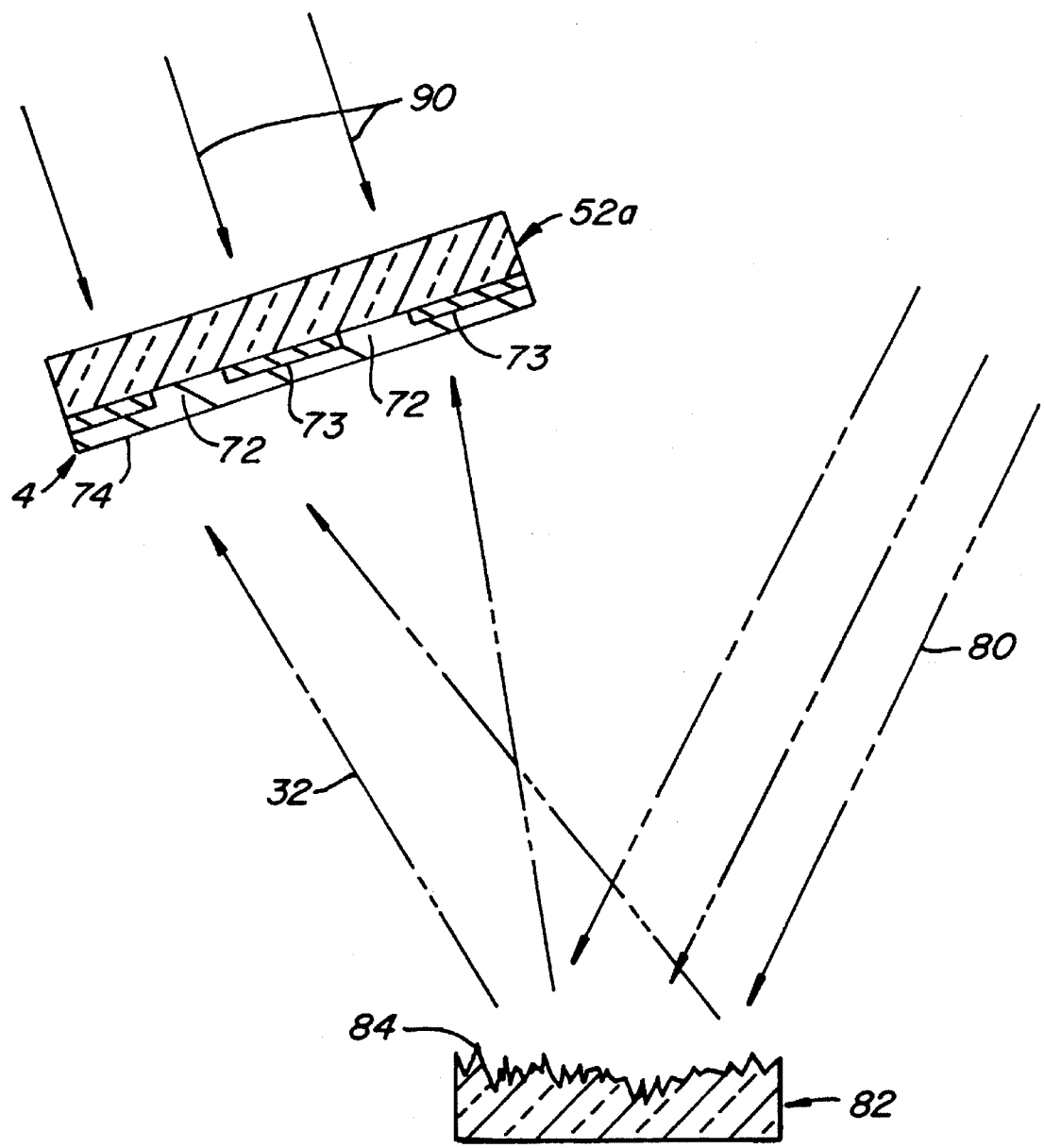
FIG. 7 is an optical schematic for the production of a phase roughened area by the expedient of the exposure of a plate to speckled light pattern by reflection from an irregular surface to produce the phase roughening of this invention.

A method of manufacture is illustrated in FIG. 7. Photoresist exposing light 80 is incident to speckle pattern dispersing plate 82 having roughened surface 84. This light is incident upon phase roughened mask 52a which has conventional blocking pattern 73 and transparent openings 72. These respective blocking pattern 73 and transparent openings 72 have been covered by photoresist layer 74. Thus, photoresist layer 74 is exposed with a speckled pattern. As before, this phase roughened mask 52a is reverse exposed with photo-resist exposing light 90. The resulting plate when conventionally developed by processes analogous to those illustrated in FIGS. 4A–4F develop a speckled pattern in the ultimately produced product.

Figure 8C:
FIGS. 8A–8C are respectively a schematic illustrating random acid etch of the phase roughened portions of the mask, the mask after the random etch, and finally the mask stripped of the acid etch block.
Figure 8B:
Figure 8A:
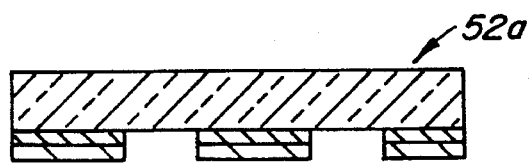
Figure 8A:
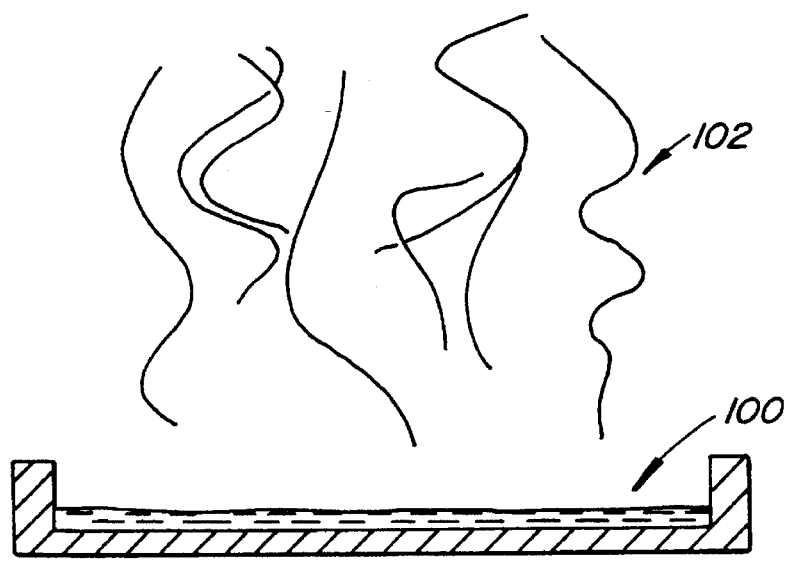

The reader should be aware that phase roughened mask 52a could also be acid etched. For example, a chrome mask coated with photoresist and flood illuminated from the back is illustrated in FIG. 8A. This is exposed to vapors 102 from hydrofluoric acid source 100 which results in etching of phase roughened mask 52a. The result of this etch is that the exposed glass is "crazed" and roughened to the extent that it scatters light into a large solid angle. The extent of the solid angle is determined by the details of the process and can readily be adapted to the limitation that the solid angle of scatter exceed the imaging systems collection aperture. Thereafter, phase roughened mask 52a is withdrawn from etch (FIG. 8B) and photoresist layer 74 and blocking pattern 73 stripped. The result of this etching process enables the simplified production of phase roughened mask 52.

Figure 10:
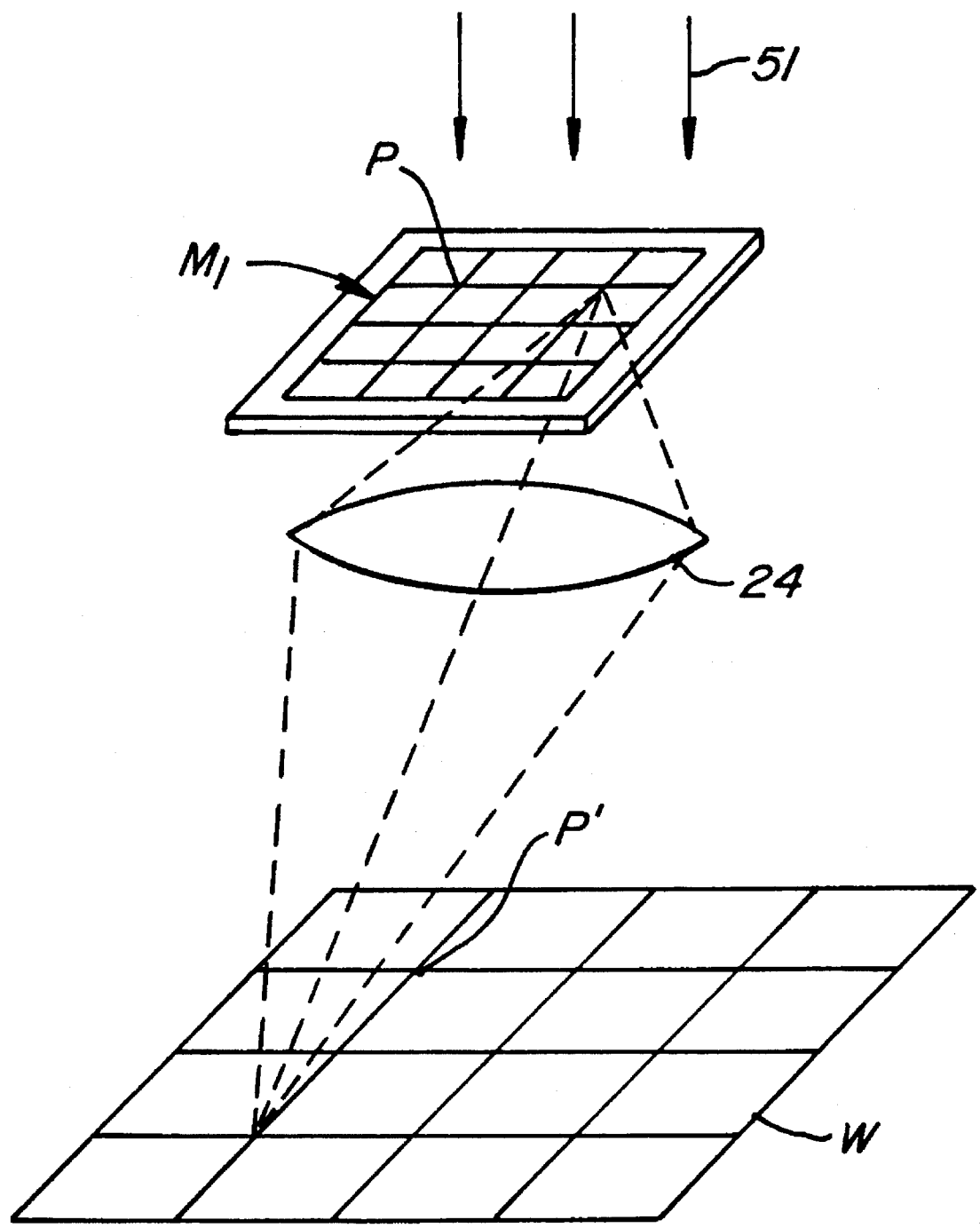
FIG. 10 is an illustration of the masks of this invention being utilized for an enlarging system where the mask is subjected to high fluences; and, FIG. 11 is an illustration of the masks of this invention being utilized for a reduction system where the mask is subjected to relatively lower fluences.

Referring to FIG. 10, an enlarging system for laser ablation is illustrated. Parallel light 51 passes through mask $M_1$ and enlarging imaging objective 24. As can be seen, pattern P of mask $M_1$ is enlarged at workpiece W in pattern P'.

Figure 11:
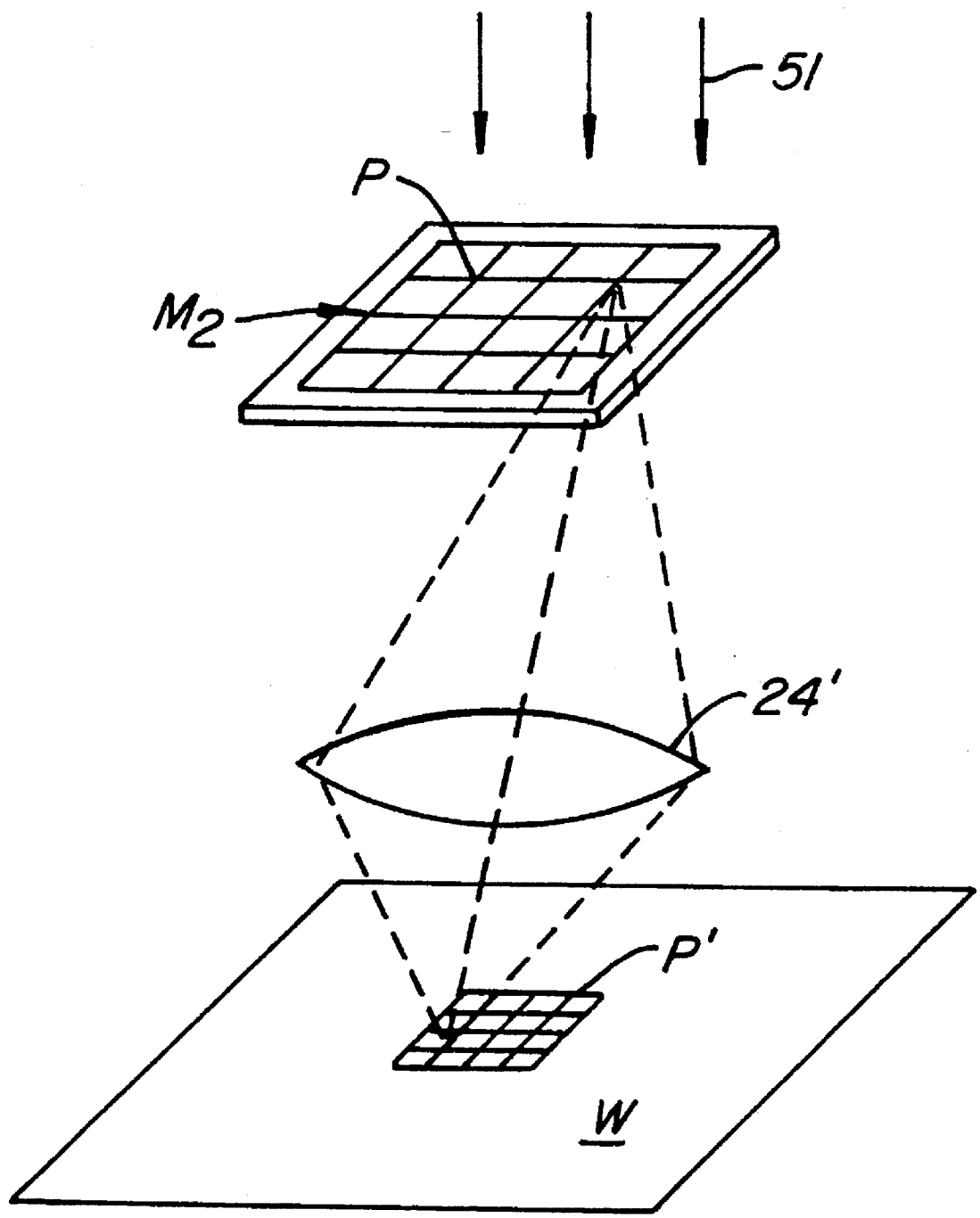

Referring to FIG. 11, a reduction system for laser ablation is illustrated. Parallel light 51 passes through mask $M_2$ and reduction imaging objective 24'. As can be seen, pattern P of mask $M_2$ is reduced at workpiece W in pattern P'.

It will be realized that the mask here illustrated have been emphasized in their preferred embodiments as related to laser ablation. The reader will recognize that utility is present when the masks are utilized in photolithographic processes.

In the foregoing specification, the term "receiving aperture" has been used. This is the same as the entrance pupil to an optical imaging system.

The invention has been described in terms of a preferred embodiments. The invention, however, is not limited to the embodiment depicted and described. Rather, the scope of the invention is defined by the appended claims.

What is claimed is:

1. A mask for use with a lens imaging system for projecting light from said mask for processing a workpiece, said mask for transmitting light to be imaged on said workpiece to the receiving aperture of an imaging system for projection on said workpiece, said mask comprising:

a transparent plate;

first patterned areas on said transparent plate for producing light images on said workpiece with sufficient intensity to process said workpiece, said first patterned areas having transmission of light within the receiving aperture of said imaging system;

second patterned areas on said transparent plate for producing light images on said workpiece with insufficient intensity to process said workpiece, said second patterned areas scattering a first substantial fraction of light outside of the receiving aperture of said imaging system and a second remaining fraction of light within the receiving aperture of said imaging system whereby said second areas produce images of reduced intensity on said workpiece through the receiving aperture of said imaging system with insufficient intensity to process said workpiece.

2. A mask for use with a lens imaging system for projecting light from said mask for processing a workpiece according to claim 1 and wherein:

said second patterned areas include a surface produced by an acid etch on said plate.

3. A mask for use with a lens imaging system for projecting light from said mask for processing a workpiece according to claim 1 and wherein:

said second patterned areas include a surface produced by exposing said photoresist with a random pattern.

4. A process of patterned laser ablation of a workpiece, said process including a mask for use with a lens imaging system for projecting coherent light through said mask for processing a workpiece, said mask for transmitting light to be imaged on said workpiece to the receiving aperture of a imaging system for projection on said workpiece, said process comprising the steps of:

providing a workpiece having a region for laser ablation, said region for laser ablation having an ablation threshold where light fluence having an intensity below said ablation threshold does not produce ablation and light fluence above said threshold does produce ablation;

providing a transparent plate;

providing a lens imaging system having a receiving aperture relative to said plate for projecting light from said plate with sufficient intensity to ablate said workpiece;

providing first patterned areas on said transparent plate for producing light images on said workpiece with fluence above said threshold for ablation of said workpiece, said first patterned areas having transmission of light within the receiving aperture of said imaging system;

providing second patterned areas on said transparent plate for producing light images on said workpiece with insufficient intensity to ablate said workpiece, said second patterned areas scattering a first substantial fraction of light outside of the receiving aperture of said imaging system and a second remaining fraction of light within the receiving aperture of said imaging system whereby said second areas produce images of light fluence below said threshold on said workpiece through the receiving aperture of said imaging system with insufficient intensity to process said workpiece.

5. A process of patterned laser ablation of a workpiece according to claim 4 and further comprising the steps of:

providing said second patterned areas on said plate with an acid etch having an irregular surface sufficient to disperse said light.

6. A process of patterned laser ablation of a workpiece according to claim 4 and further comprising the steps of:

providing said second patterned areas on said plate with a surface produced by exposing said photoresist with a random pattern.

7. A process of patterned laser ablation of a workpiece according to claim 4 and where said step of providing a lens imaging system includes:

providing an enlarging lens imaging system for producing an image having ablated areas larger than but corresponding to said first patterned areas on said plate.

8. A process of patterned laser ablation of a workpiece according to claim 4 and where said step of providing a lens imaging system includes:

providing a reducing lens imaging system for producing an image having ablated areas smaller than but corresponding to said first patterned areas on said plate.

9. A method of producing a mask on a transparent plate for use with a projecting system having a receiving aperture for processing a workpiece with images from said mask, said method comprising the steps of:

providing a transparent plate for the transmission of light through said plate for the processing of said workpiece;

defining first regions on said plate having first patterns for producing from said first patterns images for transmission through the receiving aperture of said imaging system to process said workpiece with said images;

defining second regions on said plate having second patterns for producing from said second patterns the scattering of at least a substantial fraction of light outside of said receiving aperture of a projecting system;

masking said second regions on first side of said plate to prevent the transmission of light through said plate;

applying photoresist over said plate coincident with said first and second defined regions;

exposing with light sensitive to said photoresist all said photoresist on said transparent plate in a pattern over all said photoresist for scattering at least a substantial fraction of light outside of the receiving aperture of said imaging system;

exposing with light sensitive to said photoresist said transparent plate from the opposite side of said plate and onto patterned photoresist over said first regions for exposing away said pattern and onto said masked second regions whereby light is blocked at said second regions from exposing away said pattern in said photoresist overlying said second regions;

developing said second regions in said pattern;

etching said glass from said developed second regions in said pattern; and, stripping said transparent plate of said developed photoresist to leave said second patterns etched on said plate at said second regions.

10. A method of producing a mask on a transparent plate for use with a projecting system according to claim 9 and wherein:

said exposing with light sensitive to said photoresist all said photoresist on said transparent plate in a pattern includes:

exposing said photoresist with first and second coherent light beams, said beams having sufficient angularity with respect to said plate to expose said photoresist with periodic constructive interference in said photoresist coating on said plate; and, varying the angularity between said first and second coherent light beams to produce a desired period between points of constructive interference on said plate.

11. A method of producing a mask on a transparent plate for use with a projecting system according to claim 9 and wherein:

exposing said photoresist with an irregular pattern including the further steps of:

providing a reflecting surface having said irregular pattern; and reflecting light sensitive to said photoresist from said reflecting surface to said photoresist to expose said photoresist with said irregular pattern.

* * * * *